United States Patent
Qi

(10) Patent No.: US 9,905,680 B2
(45) Date of Patent: Feb. 27, 2018

(54) LATERAL INSULATED-GATE BIPOLAR TRANSISTOR

(71) Applicant: CSMC TECHNOLOGIES FAB1 CO., LTD., Wuxi New District, Jiangsu (CN)

(72) Inventor: Shukun Qi, Jiangsu (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 15/538,450

(22) PCT Filed: Sep. 10, 2015

(86) PCT No.: PCT/CN2015/089302
§ 371 (c)(1),
(2) Date: Jun. 21, 2017

(87) PCT Pub. No.: WO2016/101654
PCT Pub. Date: Jun. 30, 2016

(65) Prior Publication Data
US 2017/0352749 A1    Dec. 7, 2017

(30) Foreign Application Priority Data
Dec. 22, 2014 (CN) .......................... 2014 1 0810523

(51) Int. Cl.
*H01L 29/739* (2006.01)
*H01L 29/08* (2006.01)

(52) U.S. Cl.
CPC ...... *H01L 29/7394* (2013.01); *H01L 29/0834* (2013.01); *H01L 29/7393* (2013.01)

(58) Field of Classification Search
None
See application file for complete search history.

(56) References Cited

U.S. PATENT DOCUMENTS 5,925,900 A * 7/1999 Amaratunga ....... H01L 29/7436
257/147
2007/0158678 A1   7/2007 Udrea
(Continued)

FOREIGN PATENT DOCUMENTS

| CN | 2914330 | 6/2007 |
|---|---|---|
| CN | 102832213 | 12/2012 |
| CN | 103413824 | 11/2013 |

OTHER PUBLICATIONS

International Search Report for international application No. PCT/CN2015/089302, dated Dec. 2, 2015, 4 pages (including English translation).

*Primary Examiner* — Michael Lebentritt
*Assistant Examiner* — Jordan Klein
(74) *Attorney, Agent, or Firm* — Hamre, Schumann, Mueller & Larson, P.C.

(57) ABSTRACT

A lateral insulated gate bipolar transistor comprises a substrate (10); an anode terminal located on the substrate, comprising: an N-type buffer region (51) located on the substrate (10); a P well (53) located in the N-type buffer region; an N-region (55) located in the P well (53); two P+ shallow junctions (57) located on a surface of the P well (53); and an N+ shallow junction (59) located between the two P+ shallow junctions (57); a cathode terminal located on the substrate; a draft region (30) between the anode terminal and cathode terminal; and a gate (62) between the anode terminal and cathode terminal.

10 Claims, 1 Drawing Sheet

(56) References Cited

U.S. PATENT DOCUMENTS

| | | | |
|---|---|---|---|
| 2008/0012043 A1* | 1/2008 | Udrea | H01L 29/0657 257/163 |
| 2011/0057230 A1* | 3/2011 | Udrea | H01L 29/66325 257/141 |
| 2015/0008481 A1* | 1/2015 | Pathirana | H01L 29/7393 257/140 |

* cited by examiner

LATERAL INSULATED-GATE BIPOLAR TRANSISTOR

FIELD OF THE INVENTION

The present invention relates to a semiconductor process, and particularly relates to a lateral insulated gate bipolar transistor.

BACKGROUND OF THE INVENTION

Lateral Insulated-Gate Bipolar Transistor (LIGBT) is commonly used in the output stage of a high-voltage power-driven integrated circuit, and the structure of LIGBT causes a lower on-resistance due to a conductive modulation effect formed by injection of double carriers electrons and holes, compared with reducing of the on-resistance by a single carrier of a lateral double diffusion metal-oxide semiconductor field effect transistor (LDMOS).

However, when LIGBT is turned off, the drift region of LIGBT has a longer turning-off time due to residual minority carrier holes, so there is a problem of a larger power consumption. Because the on-resistance and the turning-off time are inversely proportional to the hole concentration, how to obtain a balance between the on-resistance and the turning-off time becomes a continual improvement in the LIGBT device.

SUMMARY OF THE INVENTION

Accordingly, it is necessary to provide a lateral insulated gate bipolar transistor, which can be turned off quickly while ensuring a lower on-resistance.

A lateral insulated gate bipolar transistor includes: a substrate; an anode terminal located on the substrate including: an N-type buffer region on the substrate; a P well in the N-type buffer region; an N-region located in the P well; two P+ shallow junctions located on a surface of the P well; and an N+ shallow junction located between the two P+ shallow junctions; a cathode terminal located on the substrate; a draft region between the anode terminal and cathode terminal; and a gate between the anode terminal and cathode terminal.

When the above lateral insulated gate bipolar transistor is turned on forwardly, an efficient injection of holes can be achieved and the on-resistance can be reduced by a longitudinal injection of the P+ shallow junctions and the P well and a lateral injection of the P+ shallow junctions; when the above lateral insulated gate bipolar transistor is turned off inversely, a path quickly extracting minority carrier (holes) is formed by the N-type buffer region, the N-region and the N+ shallow junctions, which achieves a quick turning-off and reduces a turning-off state loss.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
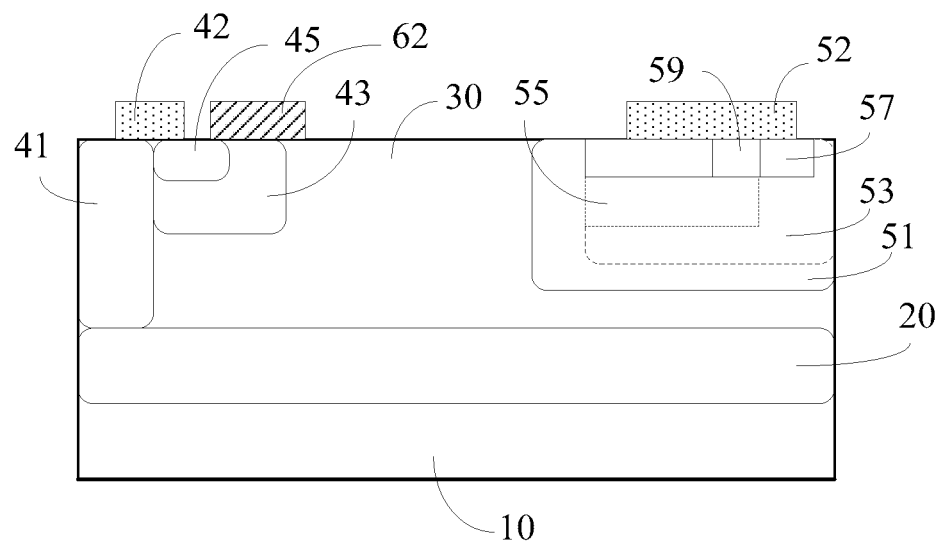
FIG. 1 shows a cross sectional diagram of a lateral insulated gate bipolar transistor in an embodiment.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a cross sectional diagram of a lateral insulated gate bipolar transistor in an embodiment. The lateral insulated gate bipolar transistor includes a substrate 10, an anode terminal and a cathode terminal on the substrate 10, a drift region 30 and a gate 62 located between the anode terminal and the cathode terminal. The anode terminal includes an N-type buffer region 51 on the substrate; a P well 53 in the N-type buffer region 51; an N-region 55 located in the P well 53; two P+ shallow junctions 57 located on a surface of the P well 53; and an N+ shallow junction 59 located between the two P+ shallow junctions 57. The cathode terminal includes a P+ region 41 located on the substrate 10; a P-type body region 43 located between the P+ region 41 and the anode terminal; an N+ region 45 located at a surface of the P-type body region 43; and a cathode metal 42 as an electrode of the emitter. The gate 62 includes a gate oxide layer (not shown) and a polysilicon gate on the gate oxide layer.

For the above lateral insulated gate bipolar transistor, when the gate 62 is biased forwardly, the device channel is opened, the electronic current passes through the channel of the P-type body region 43 via the N+ region 45 of the emitter, and flows into the drift region 30 and the N-type buffer region 51 in sequence. However, when the P+ shallow junctions 57 of the anode terminal is biased forwardly and the bias voltage is lower, holes begin to inject into the N-type buffer region 51 downward from the P+ shallow junctions 57 and the P well 53 of the anode terminal; as the bias voltage on the anode metal 52 raises, the P+ shallow junctions 57 also inject holes into the drift region 30 laterally via the N-type buffer region 51, which achieves efficient majority carrier holes injection of multiple paths and significantly reduces the on-resistance. When the lateral insulated gate bipolar transistor is turned off, the anode is biased inversely, a lower resistance path of electronic injection is formed by the N+ shallow junction 59, the N-region 55 and the N-type buffer region 51, and then residual minority carrier holes in the drift region 30 are extracted quickly to achieve a quick tuning-off, which ensures a quicker switching speed. Therefore, when the device is turned on forwardly, an efficient injection of holes can be achieved and the on-resistance can be reduced by a longitudinal injection of the P+ shallow junctions 57 and the P well 53 and a lateral injection of the P+ shallow junctions 57; when the device is turned off inversely, a path quickly extracting minority carrier (holes) is formed by the N-type buffer region 51, the N-region 55 and the N+ shallow junctions 59, which achieves a quick turning-off and reduces a turning-off state loss.

Figure 2:
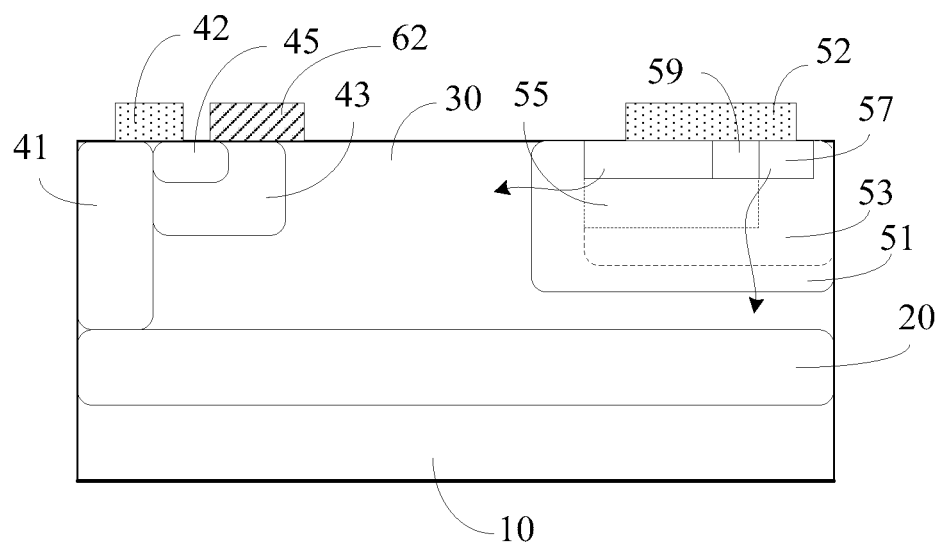
FIG. 2 shows a flow direction diagram of holes when the anode of the device shown in FIG. 1 is biased forwardly.

In the embodiment shown in FIG. 1, the doped concentration of each region satisfies the following relationships: a doped concentration of the N-type buffer region 51 is less than a doped concentration of the P well 53; the doped concentration of the P well 53 is slightly less than a doped concentration of the N-region 55; and the doped concentration of the N-region 55 is less than doped concentrations of the two P+ shallow junctions 57 and the N+ shallow junction 59. The N-region 55 is a key of controlling lifetime of minority carrier and is designed to have a suitable doped concentration, which can form a longitudinal (the P+ shallow junctions 57→the N-region 55→the P well 53) VPNP. FIG. 2 illustrates the flow direction of holes when the anode is biased forwardly by an arrow. In order to obtain an idea flow path of carriers, in the embodiment shown in FIG. 1 and FIG. 2, the one of two P+ shallow junctions 57 that is positioned closer to the cathode terminal and the N+ shallow junction 59 are disposed at a surface of the N-region 55.

In an embodiment, the doped concentration of the N-type buffer region 51 is $10^{15}/cm^3$; the doped concentration of the P well 53 is $10^{17}/cm^3$; and the doped concentrations of the P+ shallow junctions 57 and the N+ shallow junction 59 are $10^{20}/cm^3$.

When the lateral insulated gate bipolar transistor is manufactured, the anode terminal forms a deep and light N-type buffer region 51 firstly by injecting N-type ions and experiencing a drive-in process under a high temperature and for a long time, and minority carriers can be captured when the lateral insulated gate bipolar transistor is turned off. Then, P-type ions are injected into the N-type buffer region 51 and the P well 53 is formed by thermal annealing; a N-region 55 of a longitudinal junction depth with a certain depth by injecting N-type ions and annealing; the N-region 55 serves as a channel of a certain width for injecting electrons and extracting holes, and then the P+ shallow junctions 57 and the N+ shallow junction 59 are formed by performing the injection process.

The silicon on insulator (SOI) technology is increasingly important in HVIC and SPIC applications, while a lower on-resistance characteristic of IGBT devices caused by high input impedance and conductive modulation effect increasingly plays an important role in power device applications. Compared with the bulk silicon junction isolation device, SOI LIGBT devices widely apply in the automotive electronics, home electronics and communications and industrial applications due to a lower current leakage, a lower on-state resistance, a high input impedance, a high package density, a fast switching, a significant noise reduction effect and a working feasibility under high temperature caused by the trench isolation. It is particularly important to require an efficient injection of holes and a significant conductive modulation effect to reduce the on-state resistance, but respectively increase the turning-off loss caused by that minority carrier holes cannot be annihilated quickly when the device is turned off. The LIGBT shown in FIG. 1 is an silicon on insulator type lateral insulated gate bipolar transistor (SOI-LIGBT) includes a buried oxide layer 20 located between the substrate 10 and the draft region 30, wherein the substrate 10 is a P-type substrate, and the drift region 30 is an N-type drift region. The junction depth of the P+ region 41 is deeper and extends to the buried oxide layer 20.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A lateral insulated gate bipolar transistor, comprising:
   a substrate;
   an anode terminal located on the substrate, comprising:
      an N-type buffer region located on the substrate;
      a P well located in the N-type buffer region;
      an N-region located in the P well;
      two P+ shallow junctions located on a surface of the P well; and
      an N+ shallow junction located between the two P+ shallow junctions;
   a cathode terminal located on the substrate;
   a drift region between the anode terminal and cathode terminal; and
   a gate between the anode terminal and cathode terminal.

2. The lateral insulated gate bipolar transistor of claim 1, characterized in that, a doped concentration of the N-type buffer region is less than a doped concentration of the P well; the doped concentration of the P well is less than a doped concentration of the N-region; and the doped concentration of the N-region is less than doped concentrations of the two P+ shallow junctions and the N+ shallow junction.

3. The lateral insulated gate bipolar transistor of claim 2, characterized in that, the doped concentration of the N-type buffer region is from $1*10^{15}/cm^3$ to $1*10^{16}/cm^3$; the doped concentration of the P well is from $1*10^{17}/cm^3$ to $1*10^{18}/cm^3$; and the doped concentrations of the two P+ shallow junctions and the N+ shallow junction are from $1*10^{20}/cm^3$ to $1*10^{21}/cm^3$.

4. The lateral insulated gate bipolar transistor of claim 3, characterized in that, the doped concentration of the N-type buffer region is $5*10^{15}/cm^3$; and the doped concentration of the P well is $8*10^{17}/cm^3$.

5. The lateral insulated gate bipolar transistor of claim 1, characterized in that, the lateral insulated gate bipolar transistor is a silicon-on-insulator type lateral insulated gate bipolar transistor, and the lateral insulated gate bipolar transistor further comprises a buried oxide layer located between the substrate and the drift region.

6. The lateral insulated gate bipolar transistor of claim 1, characterized in that, the substrate is a P-type substrate; and the drift region is an N-type drift region.

7. The lateral insulated gate bipolar transistor of claim 6, characterized in that, the cathode terminal comprises:
 a P+ region located on the substrate;
 a P-type body region located between the P+ region and the anode terminal; and
 an N+ region located at a surface of the P-type body region.

8. The lateral insulated gate bipolar transistor of claim 7, characterized in that, the P+ region extends to the buried oxide layer.

9. The lateral insulated gate bipolar transistor of claim 7, characterized in that, the anode terminal further comprises an anode metal; the cathode terminal further comprises a cathode metal; and the gate comprises a gate oxide layer and a polysilicon gate on the gate oxide layer.

10. The lateral insulated gate bipolar transistor of claim 1, characterized in that, one of two P+ shallow junctions that is positioned closer to the cathode terminal and the N+ shallow junction are disposed at a surface of the N-region.

* * * * *